United States Patent
Watanabe et al.

(10) Patent No.: US 8,471,484 B2
(45) Date of Patent: Jun. 25, 2013

(54) REVERSED-POLARITY PULSE GENERATING CIRCUIT FOR DIRECT CURRENT PLASMA AND DIRECT CURRENT PLASMA POWER SUPPLY UNIT

(75) Inventors: Kiyomi Watanabe, Tokyo (JP); Kazuo Sakai, Tokyo (JP); Kenichi Nakamura, Tokyo (JP)

(73) Assignee: Origin Electric Company, Limited, Tokyo (JP)

( * ) Notice: Subject to any disclaimer, the term of this patent is extended or adjusted under 35 U.S.C. 154(b) by 160 days.

(21) Appl. No.: 13/193,862

(22) Filed: Jul. 29, 2011

(65) Prior Publication Data

US 2012/0025726 A1 Feb. 2, 2012

(30) Foreign Application Priority Data

Jul. 30, 2010 (JP) .................................. 2010-172652

(51) Int. Cl.
*H05B 37/02* (2006.01)

(52) U.S. Cl.
USPC ........................................................ 315/205

(58) Field of Classification Search
USPC .............. 315/111.21, 111.51, 111.71, 200 R, 315/209 R, 248, 283, 291, 205
See application file for complete search history.

(56) References Cited

U.S. PATENT DOCUMENTS

| | | | | |
|---|---|---|---|---|
| 5,111,115 A | * | 5/1992 | Ball et al. | 315/239 |
| 5,559,402 A | * | 9/1996 | Corrigan, III | 315/169.3 |
| 5,864,212 A | * | 1/1999 | Sullivan | 315/205 |
| 5,986,410 A | * | 11/1999 | Nerone | 315/209 R |
| 7,078,867 B2 | * | 7/2006 | Samejima et al. | 315/219 |

FOREIGN PATENT DOCUMENTS

| | | |
|---|---|---|
| JP | 10-298755 A | 11/1998 |
| JP | 2005-347212 A | 12/2005 |
| JP | 2006-274393 A | 10/2006 |

* cited by examiner

*Primary Examiner* — Minh D A
(74) *Attorney, Agent, or Firm* — Hoffmann & Baron, LLP

(57) ABSTRACT

A capacitor is connected between direct current voltage terminals, and inductance means is connected between one end of the capacitor and one of load terminals. In a case in which the direct current voltage exceeds a set value, voltage at both ends of the capacitor is shared by the first and second switching elements that are not electrically conductive; in a case in which the direct current voltage is below the set value, the first and second switching elements are electrically conductive on a periodic basis or as needed to output reversed-polarity voltage between load terminals; and in a case in which the first and second switching elements are turned off, voltage at both ends of the capacitor restricts voltage applied to both ends of the first and second switching elements, during a period in which the first and second feedback rectifier elements are electrically conductive.

5 Claims, 5 Drawing Sheets

REVERSED-POLARITY PULSE GENERATING CIRCUIT FOR DIRECT CURRENT PLASMA AND DIRECT CURRENT PLASMA POWER SUPPLY UNIT

The present application claims the benefit of Japanese Patent Application No. 2010-172652, filed on Jul. 30, 2010, the subject matter of which is hereby incorporated herein by reference.

BACKGROUND OF THE INVENTION

1. Field of the Invention

The present invention relates to a reversed-polarity pulse generating circuit for direct current plasma, which generates a reversed-polarity voltage pulse being effective for suppressing or preventing occurrence of abnormal electrical discharge such as arc discharge in a direct current plasma device.

2. Related Art

Conventionally, in a direct current plasma device that utilizes a plasma discharge generated in vacuum, such as a sputtering device, a PVD (Physical Vapor Deposition) device, a CVD (Chemical Vapor Deposition) device, and an etching device, impedance between electrodes in the plasma load may be reduced, or foreign matter such as conductive dust may result in a short circuit between the electrodes. In such a case, the plasma discharge occurring in vacuum in the plasma load may temporarily become an abnormal electrical discharge such as an arc discharge. In particular, if such an abnormal electrical discharge occurs in a sputtering device, the target may melt. In a sputtering device, for example, if the target melts while sputtering a substrate material such as a liquid crystal panel, the substrate material becomes defective. Moreover, for example, if the target melts while sputtering a metal film of a CD or DVD, the metal film becomes defective. Such issues bring about a problem of deteriorating product yield. Therefore, the occurrence of such abnormal electrical discharge must be suppressed as much as possible.

With reference to, for example, Japanese Unexamined Patent Application, Publication No. 2005-347212 (hereinafter referred to as Patent Document 1), a conventional method as a countermeasure against abnormal electrical discharge in a direct current plasma device is to extinguish abnormal electrical discharge in a short time by applying a reversed-polarity voltage pulse to the plasma load when an occurrence of an abnormal electrical discharge has been detected. In addition, as another countermeasure against abnormal electrical discharge, a method is disclosed which prevents occurrence of abnormal electrical discharge by periodically applying reversed-polarity voltage to the plasma load as described above.

Furthermore, with reference to Japanese Unexamined Patent Application, Publication No. 2006-274393 (hereinafter referred to as Patent Document 2), another method as a countermeasure against abnormal electrical discharge is disclosed, which is a technique in which a phenomenon immediately before the occurrence of abnormal electrical discharge is detected as a predictor of the occurrence of abnormal electrical discharge, and reversed-polarity voltage is applied to the plasma load immediately before the occurrence of abnormal electrical discharge as previously described, thereby preventing the occurrence of abnormal electrical discharge.

The methods as countermeasures against abnormal electrical discharge as described above are effective in that abnormal electrical discharge having occurred can be immediately extinguished, and abnormal electrical discharge can be prevented from occurring. In this way, various configurations have already been proposed for implementing methods as countermeasures against abnormal electrical discharge.

Furthermore, for example, with reference to Japanese Unexamined Patent Application, Publication No. H10-298755 (hereinafter referred to as Patent Document 3), a circuit is used, in which an additional winding wire, magnetically coupled to inductance means for stabilizing an electric current flowing through a plasma load, is serially connected with a switching element for reversed-polarity voltage application. In this circuit, when an abnormal electrical discharge occurs in a plasma load, a switching element for reversed-polarity voltage application is made electrically conductive, the inductance means generates a positive voltage pulse with reversed-polarity in the inductance means, the voltage value thereof being higher than the voltage value of the negative voltage generated in the inductance means, and a reversed-polarity voltage pulse is applied to the plasma load by utilizing the positive voltage with the reversed-polarity. As a result, abnormal electrical discharge is promptly extinguished.

In a case of a power supply unit for direct current plasma, when the direct current voltage that is output from the power supply unit for direct current plasma in a plasma discharging state is Vo, the power supply unit is in a substantially unloaded state before plasma discharge (plasma ignition), and outputs direct current high voltage of 1.5 to 1.8 Vo that is necessary for generating plasma discharge. Therefore, not only the invention of Patent Document 3 but also the aforementioned switching elements for reversed-polarity voltage application used in the methods as countermeasures against abnormal electrical discharge must have a breakdown voltage capable of withstanding direct current high voltage of at least 1.5 to 1.8 Vo.

In the invention of Patent Document 3, although a power supply unit for supplying special reversed-polarity voltage is not required, the leakage inductance between the winding wires of the inductance means, and the surge voltage due to the wiring inductance are superimposed on the reset voltage that is necessary for resetting the inductance means. In order to reduce the influence of the surge voltage, a voltage surge absorption circuit must be connected in parallel with the switching element for reversed-polarity voltage application. Such a voltage surge absorption circuit is composed of a resistor and a capacitor with sufficient current-carrying capacity, and increases the power loss. Particularly in a case in which the switching element for reversed-polarity voltage application is periodically switched, there is a problem in that power loss and heat generation of the voltage surge absorption circuit increase. Even if such a voltage surge absorption circuit is provided, a switching element for reversed-polarity voltage application with rated direct current high voltage being approximately 2.5 to 3 times the direct current voltage Vo is required.

When describing with specific numeric values as an example, in a case of a direct current plasma device with direct current voltage Vo of 800 V, a switching element for reversed-polarity voltage application with rated voltage of 2000 to 2400 V is required. By using an IGBT as a switching element for reversed-polarity voltage application, and serially connecting two units of commercially available low-cost IGBTs with rated voltage of 1,200 V, it is possible to obtain a switching element for reversed-polarity voltage application having breakdown voltage of 2,400 V in total. This switching element for reversed-polarity voltage application having a breakdown voltage of 2,400 V can clearly withstand direct current high voltage before plasma ignition of approximately 1200 to 1500 V corresponding to the voltage of 1.5 to 1.8 Vo as described above.

Although the switching element for reversed-polarity voltage application having such a configuration of serially connecting IGBTs is economically excellent, the switching speed thereof is slower than that of high-speed semiconductor switching elements such as an FET. Therefore, the switching element for reversed-polarity voltage application with a configuration of serially connecting IGBTs has a problem of not being suitable for use as a countermeasure against abnormal electrical discharge for preventing the occurrence of abnormal electrical discharge by applying a high-frequency reversed-polarity voltage pulse to the plasma load. On the other hand, although an FET in general has higher switching speed and smaller ON resistance than an IGBT, many FETs have lower breakdown voltage than IGBTs. For example, although FETs with a rated voltage of 1,200 V are commercially available, an FET with this type of high breakdown voltage has higher ON resistance than a general-purpose FET with breakdown voltage of 500 to 600 V. If two FETs with this type of high breakdown voltage are serially connected, the power loss due to the high ON resistance is increased, and the heat generation is also increased. Moreover, an FET with this type of high breakdown voltage is not suitable for use in generating a reversed-polarity voltage pulse for direct current plasma for reasons such as the switching speed being inferior to a general-purpose FET with breakdown voltage of 500 to 600 V.

In the conventional circuit configuration in which the reversed-polarity voltage is applied to the plasma load as described above, by considering the high surge voltage that occurs when turning off the switching element for reversed-polarity voltage application, there has been a need for a switching element for reversed-polarity voltage application with high rated voltage, and in addition, for a large voltage surge absorption circuit that absorbs such surge voltage. Furthermore, the surge electric power absorbed by the voltage surge absorption circuit is needlessly wasted, and the heat generation of the voltage surge absorption circuit is increased, which is not desirable in terms of economy and environment.

SUMMARY OF THE INVENTION

An object of the present invention is to reduce the surge voltage occurring when turning off a switching element for reversed-polarity voltage application, and to reduce the voltage applied to the switching element for reversed-polarity voltage application, as compared to conventional circuit configurations.

The reversed-polarity pulse generating circuit for direct current plasma according to an embodiment of the present invention includes: a pair of direct current voltage terminals, to which direct current voltage from a direct current power supply for plasma is applied; a pair of load terminals connected to a plasma load; a capacitor connected between the pair of direct current voltage terminals; inductance means connected between one end of the capacitor and one of the load terminals; a unit switching circuit connected in parallel with the capacitor; and a control circuit, to which direct current voltage of the pair of direct current voltage terminals is input, and which controls conduction of a first switching element and a second switching element in the unit switching circuit, in which the unit switching circuit includes: a series circuit connected in parallel with the capacitor, the series circuit having the first switching element, a first winding wire magnetically coupled to a winding wire of the inductance means or a second winding wire connected in parallel with the inductance means, and the second switching element; a first feedback rectifier element connected in parallel with the first switching element and the first winding wire that are connected in series with each other; a second feedback rectifier element connected in parallel with the second switching element and the first winding wire that are connected in series with each other; and each voltage balance resistor, which is connected in parallel with each of the first switching element and the second switching element or each of the first feedback rectifier element and the second feedback rectifier element, in which, in a case in which the direct current voltage between the pair of direct current voltage terminals exceeds a set value, voltage at both ends of the capacitor is shared by the first switching element and the second switching element, without the first switching element and the second switching element being electrically conductive; in a case in which the direct current voltage between the pair of direct current voltage terminals is below the set value, on a periodic basis or upon detecting occurrence of abnormal electrical discharge or detecting prediction of occurrence of abnormal electrical discharge, the first switching element and the second switching element are electrically conductive, reversed-polarity voltage, which is higher than the direct current voltage between the direct current voltage terminals in a plasma generating state, is applied to the inductance means, and difference reversed-polarity voltage, of which level is equivalent to a level of difference between the direct current voltage between the direct current voltage terminals in the plasma generating state and the reversed-polarity voltage, is output between the load terminals; and in a case in which the first switching element and the second switching element are turned off, during a period in which the first feedback rectifier element and the second feedback rectifier element are electrically conductive, voltage at both ends of the capacitor restricts voltage applied to both ends of the first switching element and both ends of the second switching element.

By employing such a configuration, before plasma ignition, the voltage at both ends of the capacitor is divided in two by way of the voltage balance resistors connected in parallel with each of the switching elements for reversed-polarity voltage application; therefore, approximately only ½ of the voltage at both ends of the capacitor is applied to each of the switching elements for reversed-polarity voltage application. Moreover, when turning off the switching elements for reversed-polarity voltage application, which were conductive in order to generate a reversed-polarity pulse, a feedback diode is made conductive, and returns the energy stored in the inductance means to the capacitor, and the voltage of the capacitor restricts the voltage at both ends of the switching elements for reversed-polarity voltage application. Therefore, as compared to conventional cases, the present invention can considerably reduce the surge voltage, and can also reduce the voltage applied to both ends of the switching elements for reversed-polarity voltage application when turning off the switching elements. In addition, the noise due to the surge voltage can also be reduced.

Furthermore, according to the present invention, since a switching element with a low rated voltage can be used, a semiconductor switch such as an FET (field effect transistor) with small ON resistance and superior switching speed can be used as the switching element for reversed-polarity voltage application. Accordingly, the cycle for applying a reversed-polarity voltage pulse to the plasma load can be made a high frequency. As a result, the influence on the plasma load can be reduced as much as possible as compared to conventional cases, and occurrence of abnormal electrical discharge such as arc discharge can be prevented more reliably.

In the reversed-polarity pulse generating circuit for direct current plasma according to the present invention, the inductance means and the first winding wire may be each wound around an identical wire core to configure a choke transformer, or the first winding wire and the second winding wire may be each wound around an identical iron core to configure a pulse transformer.

By employing such a configuration, the first winding wire is wound around the wire core of the inductance means to configure a choke transformer, and the first winding wire is magnetically coupled to the winding wire of the inductance means; as a result, a voltage pulse induced in the first winding wire can generate a reversed-polarity voltage pulse in the inductance means. Alternatively, a reversed-polarity voltage pulse generated in the secondary winding wire of the pulse transformer can be applied to both ends of the inductance means.

Moreover, the reversed-polarity pulse generating circuit for direct current plasma according to the present invention further includes one or more sets of the capacitor and the unit switching circuit, in which the plurality of capacitors are serially connected with each other between the pair of direct current voltage terminals, the plurality of unit switching circuits are respectively connected to the plurality of capacitors, and each of the first winding wires of the unit switching circuits may be wound around and magnetically coupled to the wire core provided to the inductance means to configure a pulse transformer, or may be wound around an iron core identical to that for each of the second winding wires connected in parallel with the inductance means to configure a pulse transformer.

Furthermore, by employing such a configuration, the breakdown voltage of the switching element for reversed-polarity voltage application can be lowered, the surge voltage can be reduced, the noise can be reduced, and the power loss can also be reduced.

The direct current plasma power supply unit according to the present invention includes any of the reversed-polarity pulse generating circuits for direct current plasma as described above. By employing such a configuration, similarly to the reversed-polarity pulse generating circuit for direct current plasma as described above, the breakdown voltage of the switching element for reversed-polarity voltage application can be lowered, the surge voltage can be reduced, the noise can be reduced, and the power loss can also be reduced.

According to the present invention, when the switching element for reversed-polarity voltage application is turned off, the voltage of the capacitor restricts (clamps) the voltage at both ends of the switching element for reversed-polarity voltage application; therefore, the surge voltage can be reduced, and the power loss due to the surge voltage can be reduced. In addition, before plasma ignition, i.e. before generating plasma discharge, the voltage of the capacitor is shared by the voltage balance resistors connected in parallel with each of the switching elements for reversed-polarity voltage application; therefore, the voltage applied to the switching elements for reversed-polarity voltage application can be reduced as compared to conventional circuit configurations.

DETAILED DESCRIPTION OF THE INVENTION

Figure 1:
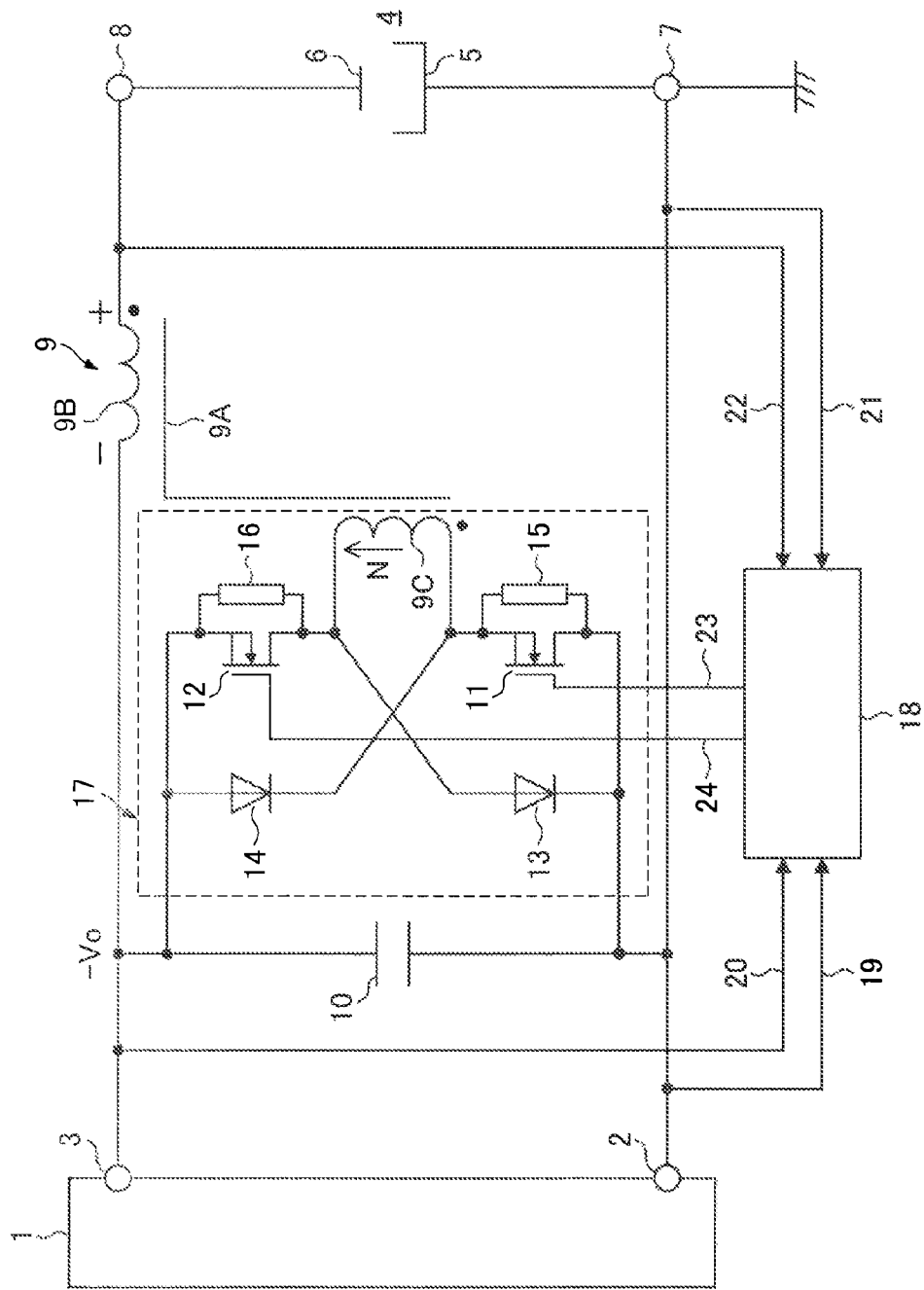
FIG. 1 is a diagram showing a reversed-polarity pulse generating circuit for direct current plasma as a first embodiment according to the present invention.

A reversed-polarity pulse generating circuit for direct current plasma according to each embodiment of the present invention is hereinafter described with reference to the drawings. It should be noted that the present invention is not limited to embodiments described below. Moreover, in each drawing, the same reference numerals respectively refer to members with the same names.

First Embodiment

A reversed-polarity pulse generating circuit for direct current plasma according to a first embodiment of the present invention is described with reference to FIGS. 1 and 2A to 2C. FIG. 1 is a diagram showing the reversed-polarity pulse generating circuit for direct current plasma as the first embodiment according to the present invention. The reversed-polarity pulse generating circuit for direct current plasma according to the present invention causes inductance means 9 to generate, periodically or as needed, a reversed-polarity voltage pulse, whose voltage value is greater than that of direct current output voltage (hereinafter referred to as direct current voltage Vo) that is output between direct current voltage terminals 2 and 3 by a direct current power supply 1 when a plasma load 4 is in a plasma generating state, and the circuit is provided between the direct current voltage terminals 2 and 3 and load terminals 7 and 8.

The reversed-polarity pulse generating circuit for direct current plasma shown in FIG. 1 is mainly configured with a capacitor 10, inductance means 9, a unit switching circuit 17, and a control circuit 18. More specifically, the reversed-polarity pulse generating circuit for direct current plasma shown in FIG. 1 includes: the pair of direct current voltage terminals 2 and 3, to which direct current voltage from a direct current power supply for plasma is applied; the pair of load terminals 7 and 8 connected to the plasma load 4; the capacitor 10 connected between the pair of direct current voltage terminals 2 and 3; the inductance means 9 connected between one end of the capacitor 10 and a terminal 8 of the pair of load terminals; and the unit switching circuit 17 connected in parallel with the capacitor 10. Furthermore, the control circuit 18 is provided, with direct current voltage of the pair of direct current voltage terminals 2 and 3 as input, and which controls conduction of a first switching element 11 and a second switching element 12 in the unit switching circuit 17. The unit switching circuit 17 includes a series circuit having: the first switching element 11 connected in parallel with the capacitor 10; a first winding wire 9C magnetically coupled to a winding wire 9B of the inductance means 9; and the second switching element 12. Moreover, the unit switching circuit 17 includes: a first feedback rectifier element 13 connected in parallel with the first switching element 11 and the first winding wire 9C that are connected in series with each other; and a second feedback rectifier element 14 connected in parallel with the second switching element 12 and the first winding wire 9C that are connected in series with each other. Furthermore, the unit switching circuit 17 includes: voltage balance resistors 15 and 16 connected in parallel with each of the first switching element 11 and the second switching element 12, or each of the first feedback rectifier element 13 and the second feedback rectifier element 14.

The direct current power supply 1 is a direct current power supply composed of a converter and the like for converting alternating current power from an alternating current power supply such as a commercial power supply into desired direct current power, and is a direct current power supply for plasma, which supplies electric power suitable for generating plasma in vacuum. The direct current power supply 1 is externally connected to the direct current voltage terminal 2 on a positive side and the direct current voltage terminal 3 on a negative side, and is not an essential component of the reversed-polarity pulse generating circuit for direct current plasma according to the present invention. The direct current power supply 1 has general voltage specifications such as, for example, no-load voltage before plasma ignition being 1,500 V, and an upper limit of rated plasma voltage being 800 V. Constant voltage control of the direct current power supply 1 is performed such that no-load voltage before plasma ignition is, for example, 1,500 V. After plasma ignition, constant power control or constant current control is performed so that voltage between the load terminals 7 and 8 applied to the plasma load 4 will be determined by conditions of the plasma load. Therefore, direct current voltage Vo that is output between the direct current voltage terminals 2 and 3 when the plasma load 4 is in a plasma generating state will also be determined by conditions of the plasma load. The direct current voltage terminal 2 on the positive side and the direct current voltage terminal 3 on the negative side are terminals that receive power of direct current voltage from the direct current power supply 1, and may be direct current output terminals of the direct current power supply 1.

The plasma load 4 for utilizing plasma generated in vacuum includes a chamber electrode 5, a target electrode 6 and the like, and is herein assumed to be a part of a sputtering device. The chamber electrode 5 and the target electrode 6 of the plasma load 4 are connected to the load terminals 7 and 8, respectively, for receiving direct current voltage and reversed-polarity voltage. The load terminal 7 connected with the chamber electrode 5 is generally grounded. It should be noted that the pulse generating circuit can be incorporated into the direct current power supply 1 by utilizing a smoothing capacitor or an inductance (not illustrated) inside the direct current power supply 1.

The capacitor 10 is connected in parallel between the pair of direct current voltage terminals 2 and 3. A general direct current power supply 1 for plasma includes a smoothing capacitor (not illustrated) for smoothing direct current output voltage on a side of outputting direct current in the direct current power supply 1 for plasma in FIG. 1, i.e. on a side of being connected between the pair of direct current voltage terminals 2 and 3. By utilizing the smoothing capacitor, the capacitor 10 in FIG. 1 can be replaced by connecting the unit switching circuit 17 in parallel with a capacitor (not illustrated) included in the direct current power supply 1 for plasma, similarly to the capacitor 10 in FIG. 1. Moreover, conversely, the smoothing capacitor can be replaced with the capacitor 10.

In order to stabilize a plasma current, the inductance means 9 with high inductance is serially connected between the load terminal 8 and a terminal on the direct current voltage terminal 3 side of the capacitor 10. In the first embodiment, a choke transformer is configured with a wire core 9A of the inductance means 9, the winding wire 9B wound around the wire core 9A, and the first winding wire 9C. Black dots in the drawing, which are added to the end of the winding wire 9B of the inductance means 9 and the end of the first winding wire 9C, denote voltage polarity. When the number of turns of the first winding wire 9C is n1, and the number of turns of the winding wire 9B is n2, the turn ratio (n2/n1) is set to be larger than 1 (n2/n1>1). Generally, the direct current power supply 1 for plasma includes inductance means with a general structure composed of an iron core (not illustrated) and a winding wire wound around the iron core, inside the direct current power supply 1 for plasma in FIG. 1. By utilizing such inductance means, similarly to the inductance means 9 in FIG. 1, the first winding wire 9C is wound around an iron core of such inductance means (not illustrated) included in the direct current power supply 1 for plasma, thereby configuring a magnetically coupled choke transformer structure, and the inductance means 9 in FIG. 1 can be replaced therewith.

Here, as shown by a broken line in FIG. 1, the unit switching circuit 17 is configured with the first winding wire 9C wound around the wire core 9A of the inductance means 9, the first and second switching elements 11 and 12, first and second feedbacks diodes 13 and 14, and the first and second voltage balance resistors 15 and 16. In the unit switching circuit 17, when the first and second switching elements 11 and 12 are turned on, so as to be electrically conductive, a pulsed current is applied to the first winding wire 9C, and by way of this pulsed current, a reversed-polarity voltage pulse is generated in the winding wire 9B of the inductance means 9 that is magnetically coupled to the first winding wire 9C.

The first and second switching elements 11 and 12 in FIG. 1 are described using an FET (field effect transistor). The series circuit, in which the first switching element 11, the first winding wire 9C and the second switching element 12 are serially connected, is connected in parallel with the capacitor 10. When the first and second switching elements 11 and 12 are turned on, so as to be electrically conductive, a path is formed to connect the terminal on the direct current voltage terminal 2 side of the capacitor 10, the first switching element 11, the first winding wire 9C, the second switching element 12 and the terminal on the direct current voltage terminal 3 side of the capacitor 10, and the voltage of the capacitor 10 is applied to the first winding wire 9C in which the black dot side in the drawing is positive. As a result of this voltage application, an excitation current of the inductance means 9 flows through the winding wire 9C in the direction illustrated by a directional arrow. It should be noted that the first and second switching elements 11 and 12 correspond to the reversed-polarity voltage application switching element as described above, and are preferably switching elements such as an FET in which the switching speed is high and the ON resistance is small; however, another switching element such as an IGBT can also be used.

The first feedback diode 13 being the first feedback rectifier element is connected in parallel with and extending over the first switching element 11 and the first winding wire 9C that are serially connected with each other; and the anode of the first feedback diode 13 is connected with a non-black dot side of the first winding wire 9C. The second feedback diode 14 being the second feedback rectifier element is connected in parallel with and extending over the second switching element 12 and the first winding wire 9C that are serially connected with each other; and the cathode of the second feedback diode 14 is connected with the black dot side of the first winding wire 9C. After the first and second switching elements 11 and 12 are turned off, when the first feedback diode 13 and the second feedback diode 14 are turned on, so as to be electrically conductive by way of the excitation current flowing through the first winding wire 9C in the direction illustrated by the directional arrow, or a surge current due to leakage inductance between the first winding wire 9C and the winding wire 9B of the inductance means 9, a path is formed to connect the first winding wire 9C, the first feedback diode 13, the capacitor 10, the second feedback diode 14, and the first winding wire 9C, and as a result, the turn-off voltage of the first and second switching elements 11 and 12 is restricted to the voltage of the capacitor 10.

The first voltage balance resistor 15 and the second voltage balance resistor 16 with a high resistance value are connected in parallel with both ends of the first switching element 11 and both ends of the second switching element 12, respectively. The first and second voltage balance resistors 15 and 16 have substantially the same resistance value such as, for example, several tens of kΩ to several MΩ. In a case in which the voltage at both ends of the capacitor 10 is applied to the series circuit including the first voltage balance resistor 15, the first winding wire 9C and the second voltage balance resistor 16, and if the direct current resistance of the first winding wire 9C is zero, then the voltage at both ends of the capacitor 10 is applied to the first and second voltage balance resistors 15 and 16. Therefore, substantially ½ of the voltage at both ends of the capacitor 10 will be uniformly shared by both ends of the first switching element 11 and both ends of the second switching element 12. It should be noted that the first and second voltage balance resistors 15 and 16 may be connected in parallel with the first feedback diode 13 and the second feedback diode 14, respectively. In other words, the first and second voltage balance resistors 15 and 16 are connected in parallel with at least one of the first and second switching elements 11 and 12 or the first and second feedback diodes 13 and 14, respectively.

Input voltage detection lines 19 and 20 for detecting voltage between the direct current voltage terminals 2 and 3, and output voltage detection lines 21 and 22 for detecting voltage between the load terminals 7 and 8 are input into the control circuit 18, from which a first signal line 23 and a second signal line 24 are output to the control terminals of the first and second switching elements 11 and 12, respectively, and the control circuit 18 controls conduction of the first and second switching elements 11 and 12. A control circuit having various control functions similar to conventional control functions is sufficient as the control circuit 18, and examples of such a control circuit may include a control circuit having a function of periodically and simultaneously supplying a turn-on drive signal to the first and second switching elements 11 and 12, or a control circuit that supplies a turn-on drive signal to the first and second switching elements 11 and 12 simultaneously as needed when an occurrence of abnormal electrical discharge is detected or when an occurrence of abnormal electrical discharge is predicted, or a control circuit having both of such functions, etc.

However, the control circuit 18 has a function to prohibit an turn-on drive signal from being supplied to the first and second signal lines 23 and 24, when direct current voltage between the direct current voltage terminals 2 and 3 detected by the input voltage detection lines 19 and 20 reaches voltage exceeding a set value. Therefore, the first and second switching elements 11 and 12 are not electrically conductive when the direct current voltage between the direct current voltage terminals 2 and 3 is a voltage exceeding the set value. It should be noted that, as a matter of convenience, FIG. 1 describes the control circuit 18 as being directly connected to the first and second switching elements 11 and 12 via the first and second signal lines 23 and 24; however, in practice, since the electric potential is different between the control circuit 18 and the first and second switching elements 11 and 12, signal isolation means such as a pulse transformer or a photocoupler (not illustrated) is provided in the middle of the first and second signal lines 23 and 24. It should be noted that illustrations are omitted for signal lines on a fixed potential side corresponding to the first and second signal lines 23 and 24.

A description is given of an overview of the reversed-polarity pulse generating circuit for direct current plasma as the first embodiment according to the present invention. In a case in which the direct current voltage between the pair of direct current voltage terminals 2 and 3 exceeds the set value, voltage at both ends of the capacitor 10 is shared by the first switching element 11 and the second switching element 12, without the first switching element 11 and the second switching element 12 being electrically conductive. In a case in which the direct current voltage between the pair of direct current voltage terminals 2 and 3 is below the set value, the first switching element 11 and the second switching element 12 are made electrically conductive periodically or upon detection of an occurrence of abnormal electrical discharge or of a prediction of occurrence of abnormal electrical discharge. In addition, difference reversed-polarity voltage is output between the load terminals 7 and 8 by applying reversed-polarity voltage, which is higher than the direct current voltage between the direct current voltage terminals 2 and 3 in a plasma generating state, to the inductance means 9, in which the level of the difference reversed-polarity voltage is equivalent to a level of difference between the direct current voltage between the direct current voltage terminals 2 and 3 in the plasma generating state and the reversed-polarity voltage. Furthermore, in a case in which the first switching element 11 and the second switching element 12 are turned off, during a period in which the first feedback rectifier element 13 and the second feedback rectifier element 14 are electrically conductive, voltage at both ends of the capacitor 10 restricts voltage applied to both ends of the first switching element 11 and both ends of the second switching element 12.

Figure 2A:
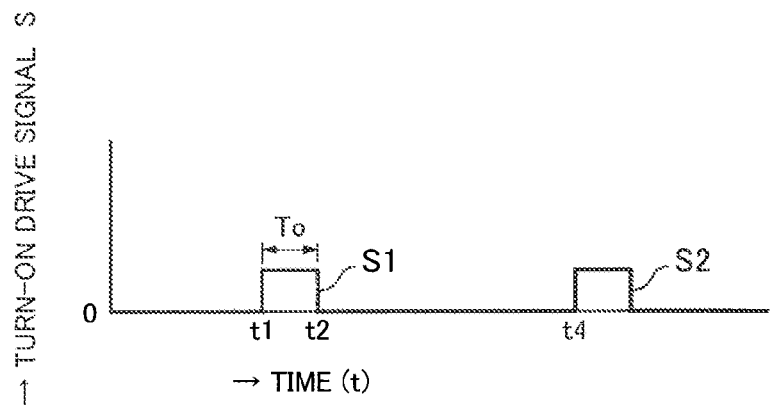
FIGS. 2A to 2C are waveform diagrams showing the reversed-polarity pulse generating circuit for direct current plasma as the first embodiment according to the present invention.
Figure 2B:
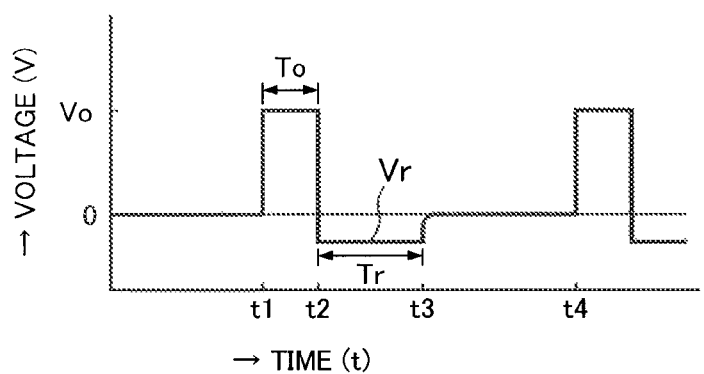
Figure 2C:
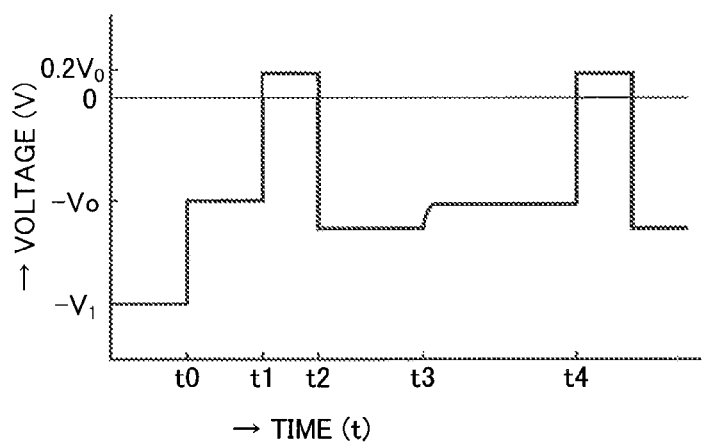

Next, descriptions are provided for operations of the reversed-polarity pulse generating circuit for direct current plasma according to the first embodiment, with reference to waveform diagrams shown in FIGS. 2A to 2C. FIG. 1 is appropriately taken into consideration in the descriptions that refer to FIGS. 2A to 2C. FIG. 2A shows turn-on drive signals S (S1, S2 . . . ) of the first switching element 11 and the second switching element 12. FIG. 2B shows voltage when the black dot side of the first winding wire 9C of the inductance means 9 is positive. FIG. 2C shows voltage of the plasma load 4, i.e. voltage that appears between the load terminals 7 and 8.

Before Plasma Ignition

Before plasma ignition, i.e. before time t0, the direct current power supply 1 for plasma outputs direct current high voltage V1 for ignition, in which a voltage value of V1 is higher than a voltage value of direct current voltage Vo. For example, the direct current high voltage source V1 is 1,500 V, and a maximum value of the direct current voltage Vo is 800 V. Therefore, the voltage between the direct current voltage terminals 2 and 3 before plasma ignition is the direct current high voltage V1, and the voltage at both ends of the capacitor 10 is also the direct current high voltage V1. In the control circuit 18, the voltage between the direct current voltage terminals 2 and 3 is detected by the input voltage detection lines 19 and 20. In a case in which the detected voltage between the direct current voltage terminals 2 and 3 voltage exceeds the set value, for example, in a case in which the detected voltage is the direct current high voltage V1, the control circuit 18 prohibits a turn-on drive signal from being supplied to the first and second signal lines 23 and 24. It should be noted that the voltage exceeding the set value is assumed to be higher than the direct current voltage Vo between the direct current voltage terminals 2 and 3 in the plasma generating state, and to be no more than the direct current high voltage V1 for ignition. In such a case, since the first and second switching elements 11 and 12 are not electrically conductive, an electric current does not flow through the first winding wire 9C. Therefore, the direct current high voltage V1 between the direct current voltage terminals 2 and 3 is applied to the path including the first voltage balance resistor 15, the first winding wire 9C and the second voltage balance resistor 16; however, if the direct current resistance of the first winding wire 9C is zero, the voltage is substantially equally divided by way of the first and second voltage balance resistors 15 and 16, and thus the voltage applied to both ends of the first and second switching elements 11 and 12 is also substantially equally divided. If the voltage between the direct current voltage terminals 2 and 3, i.e. voltage at both ends of the capacitor 10, is V1, the voltage applied to both ends of the first and second switching elements 11 and 12 will be voltage equivalent to V1/2. In the above example, the voltage will be 750 V, which is equivalent to V1/2.

After Plasma Ignition

When the direct current high voltage V1 for ignition is applied between the load terminals 7 and 8 via the direct current voltage terminals 2 and 3, at time t0, the plasma load 4 is assumed to ignite and enter a plasma discharging state. In this state, a direct current flows through the winding wire 9B of the inductance means 9, and the inductance means 9 functions as an ordinary inductance to stabilize the plasma current. It should be noted that, before time t0, the first and second switching elements 11 and 12 are not electrically conductive, and thus an electric current does not flow through the first winding wire 9C. When plasma ignites in the plasma load 4, the direct current power supply 1 for plasma reduces the output voltage and outputs the direct current voltage Vo; therefore, in FIG. 2C, the voltage of the plasma load 4 will be the direct current voltage Vo at time t0. After the plasma ignition, as described above, the direct current voltage Vo that is output between the direct current voltage terminals 2 and 3 will be determined by conditions of the plasma load. Between time t0 to t1, when direct current voltage between the direct current voltage terminals 2 and 3 is detected to be lower than the set value, for example, of 800 V as the maximum value of the direct current voltage Vo, the control circuit 18 cancels the prohibition of occurrence of a turn-on drive signal S, and stands by in a state of being capable of supplying a turn-on drive signal S to the first and second signal lines 23 and 24 as needed.

It is assumed that the control circuit 18 has a function to periodically and repeatedly output a turn-on drive signal S with a pulse width To as shown in FIG. 2A. After the direct current voltage between the direct current voltage terminals 2 and 3 is detected to be lower than the set value, at time t1 within a single cycle, the control circuit 18 simultaneously provides a first turn-on drive signal S1 to the control terminals of the first and second switching elements 11 and 12 via the first and second signal lines 23 and 24. As a result, the first and second switching elements 11 and 12 are substantially simultaneously turned on, so as to be electrically conductive, voltage is applied to the first winding wire 9C such that the polarity on the black dot side is positive, and as shown in FIG. 2B, at time t1, the voltage both ends of the capacitor 10 is applied to the first winding wire 9C such that the polarity on the black dot side is positive.

As described above, n2/n1>1 is assumed such that the number of turns n2 of the winding wire 9B of the inductance means 9 is greater than 1 when the number of turns n1 of the first winding wire 9C is 1; therefore, in the winding wire 9B of the inductance means 9, a voltage pulse with a value higher than the negative direct current voltage is induced such that the polarity on the black dot side of the winding wire 9B is positive, as shown in FIG. 1. In other words, the inductance means 9 of the first embodiment functions as a choke transformer, in which the first winding wire 9C is a primary winding wire, and the winding wire 9B of the inductance means 9 is a secondary winding wire. For example, if the direct current voltage is Vo, and the aforementioned turn ratio (n2/n1) of the first winding wire 9C and the winding wire 9B of the inductance means 9 is 1.2, when the first and second switching elements 11 and 12 are turned on, so as to be electrically conductive, a voltage pulse equivalent to 1.2 Vo with positive polarity is induced in the winding wire 9B of the inductance means 9.

As a result of the negative direct current voltage Vo being subtracted from the positive voltage pulse equivalent to 1.2 Vo of the winding wire 9B of the inductance means 9, as shown in FIG. 2C, a positive voltage pulse equivalent to 0.2 Vo is applied between the load terminals 7 and 8. This voltage pulse has a positive polarity being reversed from the negative direct current voltage Vo, and thus is referred to as a reversed-polarity voltage pulse. In this way, difference reversed-polarity voltage 0.2 Vo is output between the load terminals 7 and 8 by generating, in the winding wire 9B of the inductance means 9, reversed-polarity voltage, which is higher than the direct current voltage Vo between the direct current voltage terminals 2 and 3 in the plasma generating state, in which the level of the difference reversed-polarity voltage is equivalent to the level of difference between the direct current voltage Vo between the direct current voltage terminals 2 and 3 in the plasma generating state and the reversed-polarity voltage 1.2 Vo.

Next, at time t2 when the turn-on drive signal S1 disappears from the first and second signal lines 23 and 24, i.e. after a period of time substantially equal to the pulse width To elapsed since time t1, the first and second switching elements 11 and 12 are turned off, so as to be not electrically conductive. As a result, the first and second feedback diodes 13 and 14 are turned on, so as to be electrically conductive, and the magnetic energy saved as an excitation current in the first winding wire 9C is returned to the capacitor 10. As a result of the first and second feedback diodes 13 and 14 being simultaneously turned on, so as to be electrically conductive, the voltage between the anode of the first feedback diode 13 and the cathode of the second feedback diode 14 is restricted to voltage substantially equivalent to the voltage at both ends of capacitor 10, i.e. the direct current voltage Vo between the direct current voltage terminals 2 and 3.

The voltage between the terminal on the direct current voltage terminal 2 side of the first switching element 11 and the terminal on the direct current voltage terminal 3 side of the second switching element 12 is also restricted to voltage substantially equivalent to the direct current voltage Vo between the direct current voltage terminals 2 and 3. Therefore, the voltage at both ends of the first switching element 11 and both ends of the second switching element 12 is restricted to the voltage at both ends of the capacitor 10, i.e. the direct current voltage Vo between the direct current voltage terminals 2 and 3. It should be noted that, during the period in which the first and second switching elements 11 and 12 are electrically conductive, the magnetic energy, which was saved in the inductance means 9 by way of the plasma current flowing through the winding wire 9B of the inductance means 9, is transferred to the first winding wire 9C side, and flows through the first and second switching elements 11 and 12; and as a result, the current flowing through the inductance means 9 substantially vanishes. During the period (To) in which the reversed-polarity voltage pulse is applied between the chamber electrode 5 and the target electrode 6 of the plasma load 4, since this voltage has a reversed polarity, discharge does not occur in the plasma load 4, and almost no electric current flows through in either direction.

At starting time t4 in the next cycle, the control circuit 18 generates a second turn-on drive signal S2 as described above. Therefore, in the aforementioned example, a reversed-polarity voltage pulse is applied between the chamber electrode 5 and the target electrode 6 of the plasma load 4 in each cycle. As described above, in the reversed-polarity pulse generating circuit for direct current plasma according to the present invention, the magnetic energy, which is saved when the inductance means 9 functions as a choke transformer, is returned to the direct current voltage terminals 2 and 3 side; therefore, a great voltage surge does not occur, a special voltage surge absorption circuit is unnecessary, the power loss is small, and the heat generation is also small.

Preferable breakdown voltage of the switching element for reversed-polarity voltage application is 120% to 150% of the maximum direct current voltage Vo. In the aforementioned example, before plasma ignition, the voltage applied to the first and second switching elements 11 and 12 is substantially equivalent and is 750 V, and the maximum direct current voltage Vo is 800 V; therefore, in this case, it is sufficient for the first and second switching elements 11 and 12 to have breakdown voltage of 900 to 1000 V, and it is sufficient for the breakdown voltage of the switching elements for reversed-polarity voltage application to be smaller than half the breakdown voltage of the conventional circuit disclosed in Patent Document 3 described above. Therefore, as a switching element for reversed-polarity voltage application, it is possible to use an FET in which the ON resistance is relatively low, and the switching speed is high. In this way, by using an MOSFET or a junction type FET as a switching element for reversed-polarity voltage application, in which the breakdown voltage is low and the switching speed is high, it is possible to generate a reversed-polarity voltage pulse that is repeated at higher frequency. Moreover, the surge voltage can be reduced, the noise can be reduced, and in addition, the power loss can also be reduced.

It should be noted that Vr shown in FIG. 2B denotes reset voltage of the inductance means 9 that functions as a choke transformer. Generally, the reset voltage of the winding wire 9B of the inductance means 9 is determined by the characteristics of the plasma nonlinear load 4, and unless the reset voltage appearing in the first winding wire 9C does not reach the direct current power supply voltage V1, the feedback diodes 13 and 14 are not electrically conductive. Although the resetting of the inductance means 9 requires the voltage/time product being equal to (direct current voltage Vo)×(pulse width To), since the reset voltage Vr is lower than the direct current voltage Vo, the reset time Tr is longer than the pulse width To of the reversed-polarity voltage pulse. Therefore, although the first and second switching elements 11 and 12 cannot be operated in a ½ duty cycle, since an on-duty reversed-polarity voltage pulse that is considerably smaller than a ½ duty is generally applied to the plasma load 4, there is no problem at all.

In the reversed-polarity pulse generating circuit for direct current plasma according to the first embodiment of the present invention, as described above, it is possible to use an FET in which the ON resistance is relatively low and the switching speed is high; therefore, it is also possible to operate the first and second switching elements 11 and 12 by way of an on-duty high-frequency turn-on drive signal of ¹⁄₁₀ (1 μs), on a periodical basis such as, for example, a 10 μs (100 kHz) cycle. In this way, by supplying a reversed-polarity voltage pulse with a small pulse width to the plasma load 4 in a short cycle, abnormal electrical discharge such as arc discharge can be more reliably prevented from occurring, without affecting the sputtering.

In the aforementioned descriptions, a preferred example has been described, in which the control circuit 18 periodically supplies a turn-on drive signal to the first and second switching elements 11 and 12 to operate switching, and a reversed-polarity voltage pulse is periodically applied to the plasma load 4. However, the control circuit 18 may include a function to supply a turn-on drive signal to the first and second switching elements 11 and 12 upon detecting an occurrence of abnormal electrical discharge or detecting a prediction of an occurrence of abnormal electrical discharge. In this case, the control circuit 18 has a function in which the level of voltage between the load terminals 7 and 8 is detected via the output voltage detection lines 21 and 22, and a turn-on drive signal is generated when the voltage value falls below the set value, or the change in voltage between the load terminals 7 and 8 is detected, and a turn-on drive signal is generated when the detected value exceeds the set value. Clearly, the control circuit 18 may have functions combining the aforementioned functions.

As described above, the reversed-polarity pulse generating circuit for direct current plasma applies a reversed-polarity voltage pulse between the target electrode 6, which is positive, and the chamber electrode 5, which is negative, in the plasma load 4. Therefore, if such a reversed-polarity voltage pulse is periodically applied to the plasma load 4, an abnormal electrical discharge such as an arc discharge is unlikely to occur, and thus an abnormal electrical discharge can be prevented from occurring. Moreover, if the reversed-polarity voltage pulse occurs when an abnormal electrical discharge occurs, such an abnormal electrical discharge can be immediately extinguished. In addition, if the reversed-polarity voltage pulse occurs when an abnormal electrical discharge is predicted to occur, the cause thereof can be extinguished before such an abnormal electrical discharge occurs. In particular, via the first and second feedback diodes 13 and 14, the surge voltage of the first and second switching elements 11 and 12 can be restricted to the level of voltage at both ends of the capacitor 10, i.e. the voltage of the direct current power supply 1, which is applied between the direct current voltage terminals 2 and 3.

Second Embodiment

Figure 3:
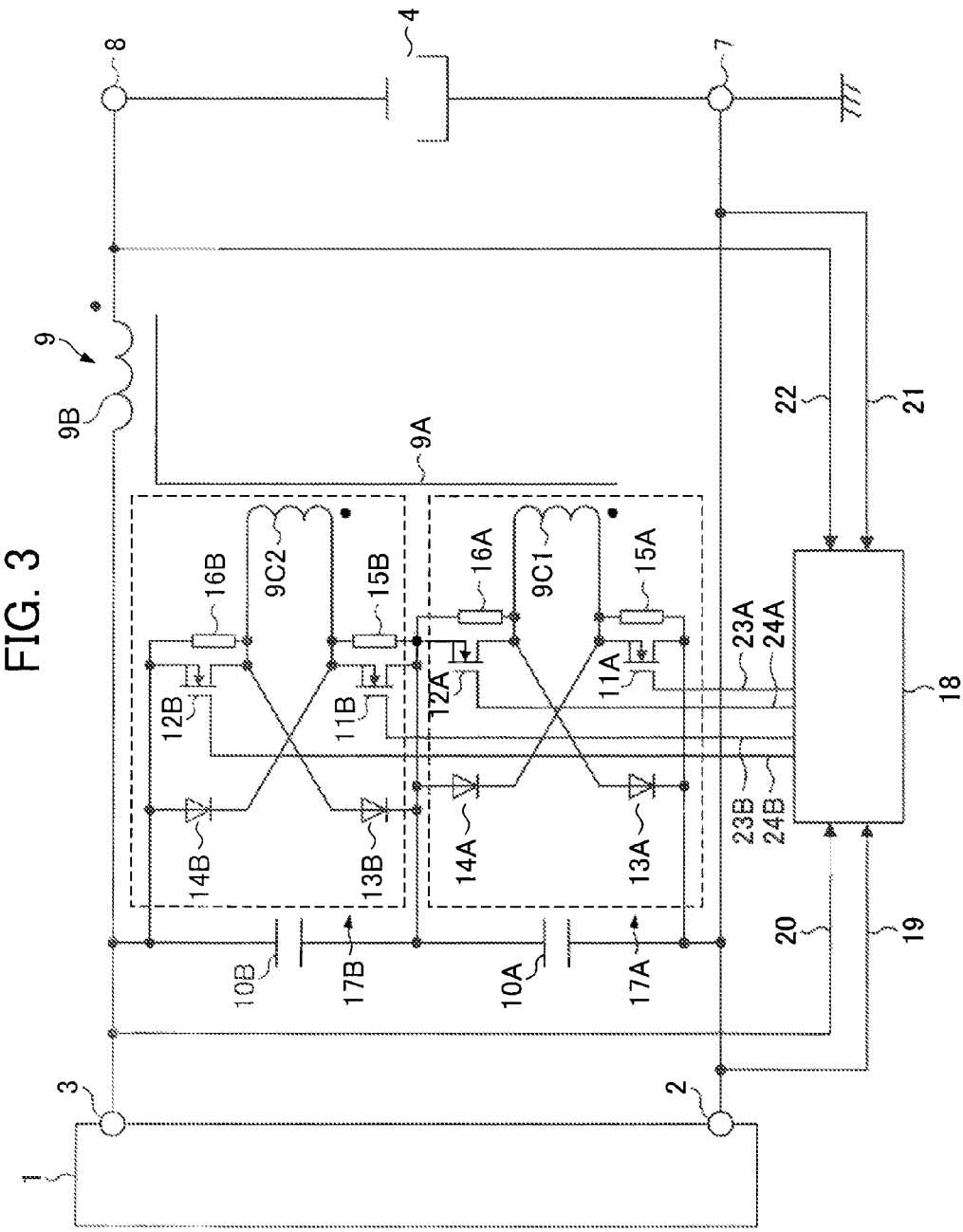
FIG. 3 is a diagram showing a reversed-polarity pulse generating circuit for direct current plasma as a second embodiment according to the present invention.

The reversed-polarity pulse generating circuit for direct current plasma according to a second embodiment of the present invention shown in FIG. 3 is mainly configured with capacitors 10A and 10B, an inductance means 9, a first unit switching circuit 17A, a second unit switching circuit 17B, and a control circuit 18. The reversed-polarity pulse generating circuit for direct current plasma according to the second embodiment of the present invention shown in FIG. 3 is characterized by including the two unit switching circuits 17A and 17B with the same circuit configuration as the unit switching circuit 17 shown in FIG. 1. More specifically, in the reversed-polarity pulse generating circuit for direct current plasma according to the second embodiment, the two capacitors 10A and 10B are serially connected with each other between a pair of direct current voltage terminals 2 and 3; the plurality of unit switching circuits 17A and 17B are connected to the two capacitors 10A and 10B, respectively; and first winding wires 9C1 and 9C2 of the respective unit switching circuits 17A and 17B are wound around a wire core 9A included in the inductance means 9 to be magnetically coupled thereto. It should be noted that descriptions are omitted for configurations and operations similar to those of the first embodiment shown in FIG. 1.

The first unit switching circuit 17A is configured with the first winding wire 9C1, first and second switching elements 11A and 12A, first and second feedback diodes 13A and 14A, and first and second voltage balance resistors 15A and 16A, which correspond to the first winding wire 9C, the first and second switching elements 11 and 12, the first and second feedback diodes 13 and 14, and the first and second voltage balance resistors 15 and 16, respectively, that are members configuring the unit switching circuit 17 shown in FIG. 1. Similarly to the unit switching circuit 17, in the first unit switching circuit 17A, when the first and second switching elements 11A and 12B are turned on, so as to be electrically conductive, a pulsed current is applied to the first winding wire 9C1, and by way of this pulsed current, a reversed-polarity voltage pulse is generated in the winding wire 9B of the inductance means 9 that is magnetically coupled to the first winding wire 9C1.

Similarly, the first unit switching circuit 17B is configured with the first winding wire 9C2, first and second switching elements 11B and 12B, first and second feedback diodes 13B and 14B, and first and second voltage balance resistors 15B and 16B, which correspond to the first winding wire 9C, the first and second switching elements 11 and 12, the first and second feedback diodes 13 and 14, and the first and second voltage balance resistors 15 and 16, respectively, that are members configuring the unit switching circuit 17 shown in FIG. 1. Similarly to the unit switching circuit 17, in the second unit switching circuit 17B, when and the first and second switching elements 11B and 12B are turned on, so as to be electrically conductive, a pulsed current is applied to the first winding wire 9C2, and by way of this pulsed current, a reversed-polarity voltage pulse is generated in the winding wire 9B of the inductance means 9 that is magnetically coupled to the first winding wire 9C2.

When the first and second switching elements 11A and 12A and the first and second switching elements 11B and 12B in the first and second unit switching circuits 17A and 17B simultaneously perform a switching operation, a substantially equivalent pulsed current simultaneously flows through the first winding wire 9C1 and the first winding wire 9C2. Since the inductance means 9 functions as a choke transformer, in which the first winding wire 9C1 and the first winding wire 9C2 are primary winding wires, and the winding wire 9B of the inductance means 9 is a secondary winding wire, a reversed-polarity voltage pulse is generated in the winding wire 9B of the inductance means 9. In the second embodiment, the number of turns of the first winding wire 9C2 is the same as that of the first winding wire 9C1, and substantially equivalent voltage is induced in the first winding wire 9C1 and the first winding wire 9C2. Voltage equivalent to this voltage in the turn ratio is induced in the winding wire 9B of the inductance means 9. Here, it is assumed that the number of turns of the first winding wire 9C1 and the first winding wire 9C2 is n1, and the number of turns of the winding wire 9B of the inductance means 9 is n2. Since the voltage at both ends of the capacitors 10A and 10B is approximately ½ of the direct current voltage between the direct current voltage terminals 2 and 3, in a case in which a reversed-polarity voltage pulse of 0.2 Vo with the positive polarity is applied to the plasma load 4 as in the first embodiment, when the number of turns n1 of the first winding wire 9C1 and the first winding wire 9C2 is 1, the number of turns n2 of the winding wire 9B of the inductance means 9 is 2.4, i.e. the turn ratio (n2/n1) is 2.4.

Since the capacitor 10A and the capacitor 10B have substantially the same characteristics such as capacitance, the direct current voltage between the direct current voltage terminals 2 and 3 is equally shared by the capacitor 10A and the capacitor 10B. Therefore, voltage that is ½ of the direct current high voltage V1 between the direct current voltage terminals 2 and 3 before plasma ignition is applied to each of the capacitor 10A and the capacitor 10B. Regarding the direct current voltage Vo after the plasma ignition, voltage that is Vo/2 is similarly applied to each of the capacitor 10A and the capacitor 10B. In other words, the voltage to be charged in each of the capacitors 10A and 10B is approximately ½ of that in the circuit configuration in FIG. 1.

The control circuit 18 is connected with the control terminals of the first and second switching elements 11A and 12A of the unit switching circuit 17A via the signal lines 23A and 24A, and is connected with the control terminals of the first and second switching elements 11B and 12B of the unit switching circuit 17B via the signal lines 23B and 24B. Moreover, as described in the first embodiment, since the electric potential is different between the control circuit 18 and the switching elements 11A, 12A, 11B and 12B, signal isolation means (not illustrated) is provided in the middle of the signal lines 23A, 24A, 23B and 24B.

The control circuit 18 has functions similar to the control circuit in the first embodiment described above, but is different from the control circuit in the first embodiment in being capable of simultaneously providing four turn-on drive signals to the control terminals of the four switching elements 11A, 12A, 11B and 12B that function as switching elements for reversed-polarity voltage application in the first and second unit switching circuits 17A and 17B. Since the reversed-polarity pulse generating circuit for direct current plasma of the second embodiment operates substantially similarly to that of the first embodiment, only different portions are described.

In a case in which the direct current voltage between the direct current voltage terminals 2 and 3 exceeds the set value, for example, in a case in which the voltage V1, which is higher than the direct current voltage Vo, is 1,500 V, the control circuit 18 does not supply a turn-on drive signal to the control terminals of the four switching elements 11A, 12A, 11B and 12B; therefore, all of the switching element 11A, 12A, 11B and 12B are not conductive. In this case, as described above, the voltage applied to each of the capacitors 10A and 10B is approximately ½ of the direct current voltage between the direct current voltage terminals 2 and 3, and thus is approximately 750 V in the aforementioned example. In the unit switching circuit 17A, the voltage of the capacitor 10A, for example, 750 V, is substantially equally divided by the voltage balance resistors 15A and 16A, and thus the voltage applied to both ends of the switching elements 11A and 12A is 375 V, which is ½ of 750 V as the voltage of the capacitor 10A. Similarly, in the unit switching circuit 17B, the voltage of the capacitor 10B, for example, 750 V, is substantially equally divided by the voltage balance resistors 15B and 16B, and thus the voltage applied to both ends of the switching elements 11B and 12B is 375 V, which is ½ of 750 V as the voltage of the capacitor 10B.

Next, when plasma is ignited in the plasma load 4, the control circuit 18 periodically outputs a turn-on drive signal, or outputs a turn-on drive signal upon detecting an occurrence of abnormal electrical discharge, or detecting a prediction of an occurrence of abnormal electrical discharge. These turn-on drive signals are simultaneously supplied to the control terminals of the four switching element 11A, 12A, 11B and 12B such that the switching elements 11A, 12A, 11B and 12B are simultaneously turned on, so as to be conductive. In a state where plasma is generated in the plasma load 4, as described above, the voltage between the direct current voltage terminals 2 and 3 is the direct current voltage Vo (for example, 800 V). Since the voltage of each of the capacitors 10A and 10B is approximately a half (for example, 400 V) of the voltage Vo, the voltage applied to both ends of the switching elements 11A, 12A, 11B and 12B is approximately a half (for example, 400 V) of the direct current voltage Vo at maximum.

Therefore, the voltage applied to both ends of the four switching elements 11A, 12A, 11B and 12B will be the voltage (375 V) corresponding to ¼ of the high voltage V1 for ignition (1,500 V, for example) before plasma ignition, and the direct current voltage Vo (800 V at maximum) will be 400 V at maximum after plasma generation. As a result, by allowing some leeway, the breakdown voltage of the switching elements 11A, 12A, 11B and 12B can be made 120% to 150% of the direct current voltage Vo, i.e., about 500 to 600 V in the aforementioned example, thereby making it possible to select a general-purpose FET, in which the ON resistance is low and the switching speed is high. This makes it possible to reduce the power loss of the switching elements 11A, 12A, 11B and 12B, reduce the pulse width of the reversed-polarity voltage pulse, and make the repeated frequency a higher frequency.

Here, the voltage balance resistors 15A and 16A and the voltage balance resistors 15B and 16B have high resistance values such as, for example, several kΩ to several MΩ. Therefore, the time constant between the capacitor 10A and the voltage balance resistors 15A and 16A and the time constant between the capacitor 10B and the voltage balance resistors 15B and 16B are increased; however, in the second embodiment, even if the switching elements 11A and 12A and the switching elements 11B and 12B are repeatedly turned on and off in a short cycle, the charging voltage of the capacitor 10A and the capacitor 10B will be balanced to be substantially equivalent, for the following reasons. In the case of the inductance means 9 of the second embodiment, the first winding wire 9C1 and the first winding wire 9C2, which have the same number of turns, are wound around the same wire core 9A; therefore, as described above, the first winding wire 9C1 and the first winding wire 9C2 are equivalently connected in parallel, and the charging voltages of the capacitor 10A and the capacitor 10B are substantially equivalent.

For example, even if the charging voltage of the capacitor 10A and the capacitor 10B is unbalanced, and the voltage of one capacitor becomes higher than the voltage of another capacitor, since the four switching elements 11A, 12A, 11B and 12B are substantially simultaneously turned on, so as to be electrically conductive, an electric current flows from a unit switching circuit with a high voltage capacitor to a unit switching circuit with a low voltage capacitor. As a result, an electric charge moves from the high voltage capacitor to the low voltage capacitor, and by periodically repeating the operation, the voltage of the capacitor 10A and the capacitor 10B is balanced to be substantially equivalent. It should be noted that when a reversed-polarity voltage pulse is generated as needed upon detecting occurrence of abnormal electrical discharge or detecting prediction of occurrence of abnormal electrical discharge, the time interval between the previous reversed-polarity voltage pulse and the subsequent reversed-polarity voltage pulse is generally long in many cases, and thus the charging voltage of the capacitor 10A and the capacitor 10B is rarely unbalanced.

Third Embodiment

In the reversed-polarity pulse generating circuit for direct current plasma according to the first embodiment of the present invention as described above, a first winding wire 9C of a unit switching circuit 17 is magnetically coupled with a winding wire 9B wound around a wire core 9A of an inductance means 9 through which a direct current flows, and a pulsed current is caused to flow through the second winding wire, thereby generating a reversed-polarity voltage pulse in the inductance means 9. However, since a main object of the inductance means in the direct current plasma device is to stabilize the direct current plasma electric current, a direct current naturally flows through the inductance means 9. Since the wire core 9A of the inductance means 9 is biased by way of a direct current, the size of the wire core 9A is increased. Moreover, in a case in which the plasma current is high, since the direct current flowing through the inductance means 9 is high, the winding wire 9B of the inductance means 9 must be formed by using a thick wire. For such reasons, the size of the inductance means 9 is increased.

Figure 4:
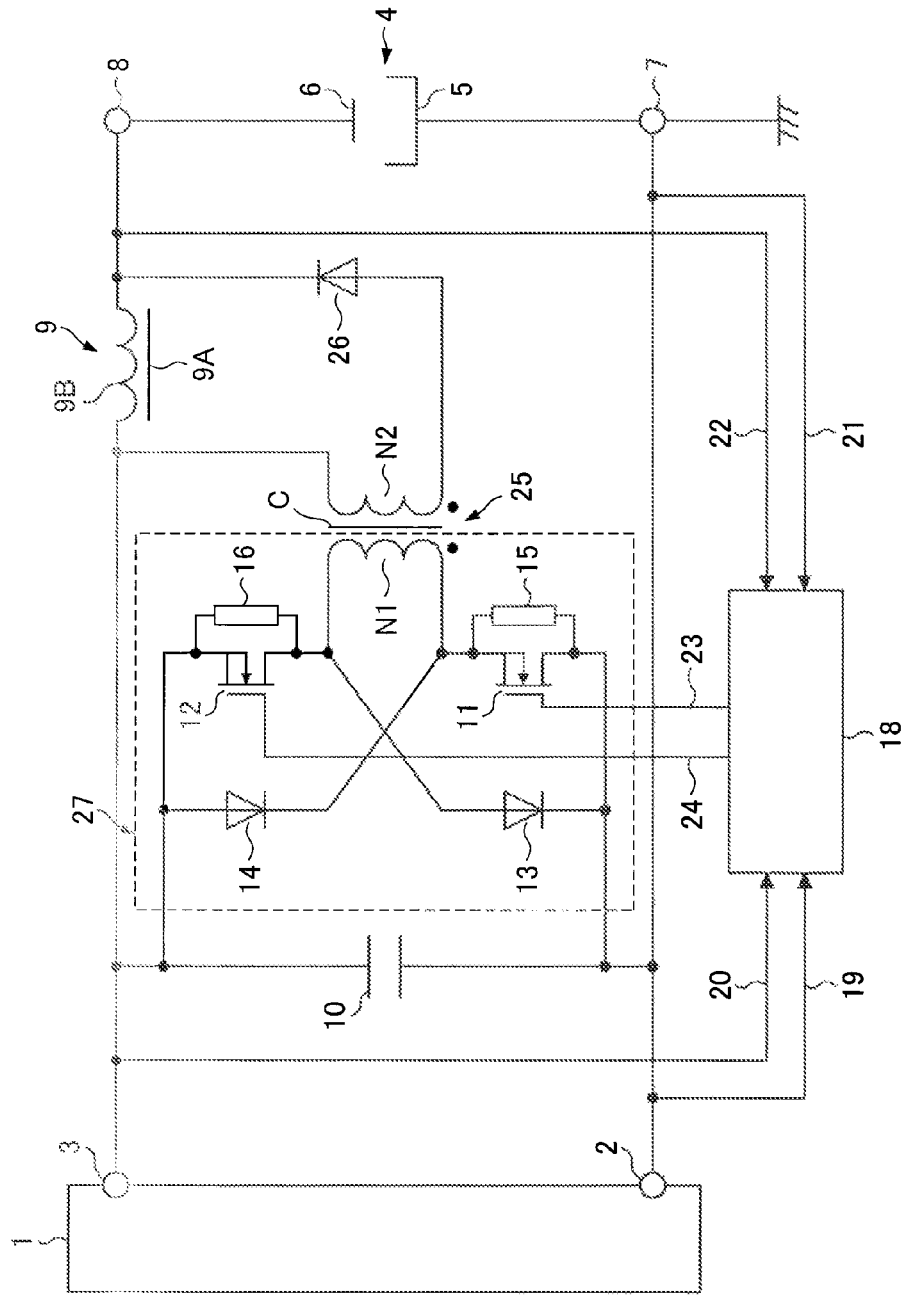
FIG. 4 is a diagram showing a reversed-polarity pulse generating circuit for direct current plasma as a third embodiment according to the present invention.

On the other hand, since only small on-duty currents flow through the first winding wire 9C, generally, an average value of currents flowing through the first winding wire 9C is considerably smaller than an average value of currents flowing through the winding wire 9B of the inductance means 9. Therefore, the thickness of the wire material of the first winding wire 9C may be as small as a fraction of the thickness of the winding wire 9B of the inductance means 9. In this way, if the first winding wire through which the small on-duty currents flow is wound around the wire core 9A of inductance means 9, with an increased size, there is a practical disadvantage. Therefore, in the third embodiment, as shown in FIG. 4, a pulse transformer is configured to have a first winding wire N1 of a unit switching circuit 27 and a secondary (second) winding wire N2, and a secondary (second) winding wire N2 of such a pulse transformer 25 is connected to the inductance means 9 via a diode 26. By employing such a configuration, voltage that is substantially the same as the voltage of a reversed-polarity voltage pulse generated in the secondary winding wire N2 of the pulse transformer 25 is applied to both ends of the inductance means 9.

The reversed-polarity pulse generating circuit for direct current plasma according to the third embodiment shown in FIG. 4 is mainly configured with a capacitor 10, the inductance means 9, the secondary winding wire N2 of the pulse transformer 25, a unit switching circuit 27, and a control circuit 18. Descriptions for configurations and operations similar to those of the reversed-polarity pulse generating circuit for direct current plasma according to the first and second embodiments are omitted. More specifically, in the reversed-polarity pulse generating circuit for direct current plasma according to the third embodiment shown in FIG. 4, the unit switching circuit 27 includes a series circuit having: a first switching element 11 connected in parallel with the capacitor 10; a primary winding wire N1 of the pulse transformer 25 as the first winding wire magnetically coupled to the secondary winding wire N2 of the pulse transformer 25 as the second winding wire connected in parallel with the inductance means 9; and the second switching element 12. In addition, the unit switching circuit 27 includes: a first feedback rectifier element 13 connected in parallel with the first switching element 11 and the first winding wire N1 that are serially connected; and the second feedback rectifier element 14 connected in parallel with the second switching element 12 and the first winding wire N1 that are serially connected. Furthermore, the unit switching circuit 27 includes: voltage balance resistors 15 and 16 connected in parallel with each of the first switching element 11 and the second switching element 12.

In other words, the reversed-polarity pulse generating circuit for direct current plasma according to the third embodiment is characterized by using an iron core C and the pulse transformer 25 composed of the primary winding wire N1 and the secondary winding wire N2 wound around the iron core C, in place of the first winding wire 9C wound around the wire core 9A of the inductance means 9 of the first embodiment. It should be noted that although both ends of the secondary winding wire N2 of the pulse transformer 25 are connected to both ends of the inductance means 9 via the diode 26 in FIG. 4, the diode 26 can be omitted in some case as described below, and thus is not an essential component. However, since the reset voltage of the pulse transformer 25 is blocked by way of the diode 26, the pulse transformer 25 can be reset by way of the direct current voltage Vo alone. In this case, when the switching elements 11 and 12 are turned off, the feedback diodes 13 and 14 will assuredly be electrically conductive by way of the excitation current.

Since many portions of the reversed-polarity pulse generating circuit for direct current plasma of the third embodiment operate substantially similarly to those of the first embodiment, only operations of different portions are described. When the first switching element 11 and the second switching element 12 are simultaneously turned on so as to be electrically conductive by way of a turn-on drive signal from the control circuit 18, an electric current flows from the direct current voltage terminal 3 side of the capacitor 10, through the first switching element 11, the primary winding wire N1 and the second switching element 12, to the direct current voltage terminal 2 side of capacitor 10. As a result, the voltage applied to the primary winding wire N1 of the pulse transformer 25 is induced in the secondary winding wire N2, at voltage corresponding to the turn ratio of the primary winding wire N1 and the secondary winding wire N2. The voltage induced in the secondary winding wire N2 is a reversed-polarity voltage pulse, which is applied to both ends of the inductance means 9.

Figure 5:
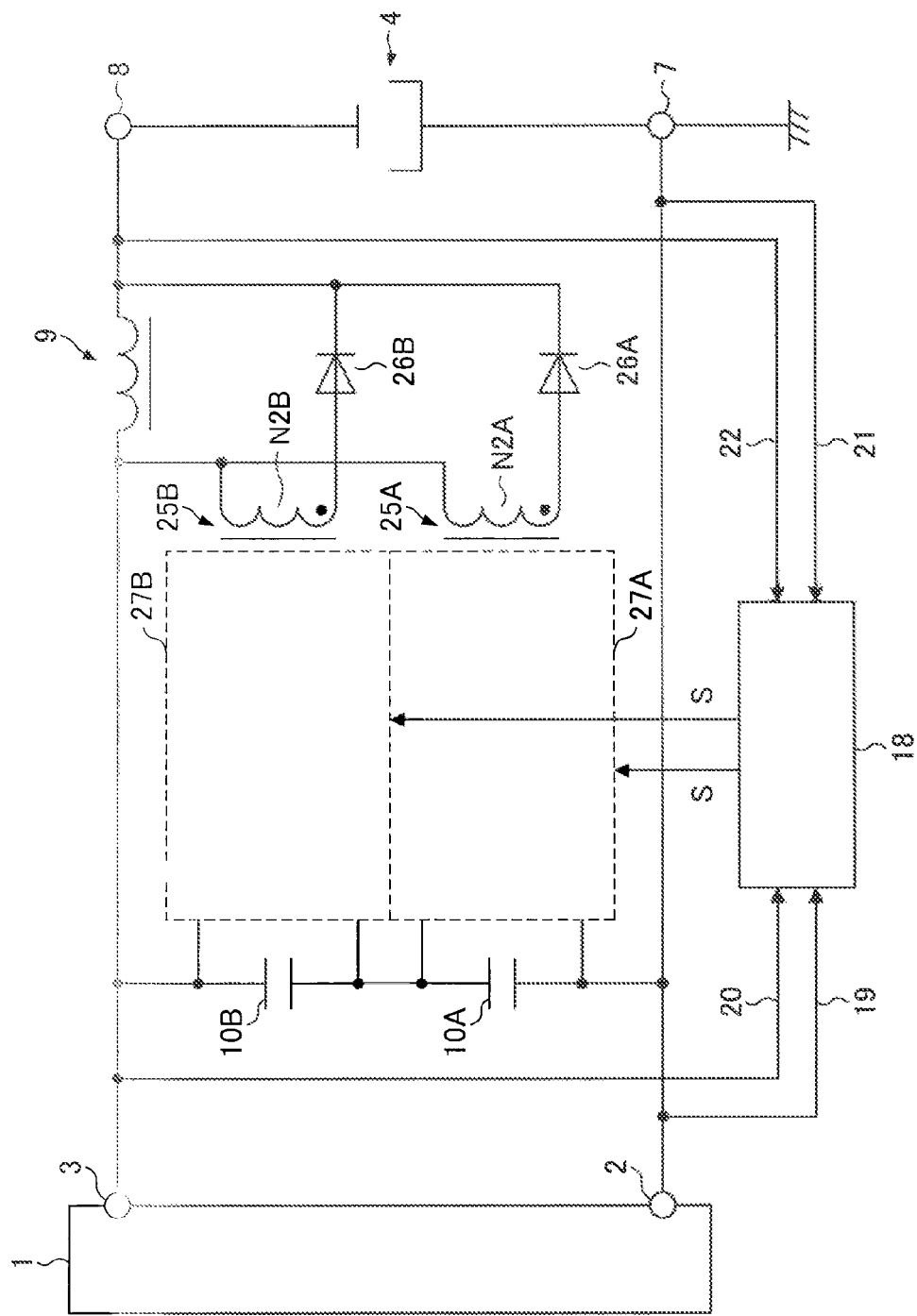
FIG. 5 is a diagram showing a reversed-polarity pulse generating circuit for direct current plasma as a fifth embodiment according to the present invention.

In the above example, a positive voltage pulse of 1.2 Vo corresponding to the voltage being 1.2 times the negative plasma voltage Vo is induced in the secondary winding wire N2. Therefore, a reversed-polarity voltage pulse of 0.2 Vo, which is obtained by subtracting the negative direct current voltage Vo from the positive voltage of 1.2 Vo, is applied between the electrodes via load terminals 7 and 8, in which a target electrode 6 is positive and the chamber electrode 5 is negative in plasma load 4. It should be noted that the purpose of the diode 26 is to prevent a direct current from flowing through the secondary winding wire N2 of the pulse transformer 25. In a case in which the direct current flowing therethrough is small, and the direct current excitation of the pulse transformer 25 is negligible, the diode 26 can be omitted Fourth Embodiment The reversed-polarity pulse generating circuit for direct current plasma according to a fourth embodiment of the present invention shown in FIG. 5 is characterized by including two unit switching circuits 27A and 27B with the same circuit configuration as a unit switching circuit 27 shown in FIG. 4. It should be noted that since the structure of the unit switching circuits 27A and 27B in FIG. 5 is similar to that of a unit switching circuit 27 in the fourth embodiment, details thereof are not illustrated.

Each of the unit switching circuits 27A and 27B has a configuration identical to the unit switching circuit 27 shown in FIG. 4 configured with the members: a primary winding wire N1 of a pulse transformer 25; a first switching element 11 serially connected with the primary winding wire N1, a second switching element 12 serially connected with the first switching element 11 via the primary winding wire N1, a first feedback diode 13 connected in parallel with and extending over the first switching element 11 and the primary winding wire N1; a second feedback diode 14 connected in parallel with the primary winding wire N1 and the second switching element 12; and voltage balance resistors 15, 16; therefore, descriptions are provided by using the reference numerals of these members.

As shown in FIG. 5, two capacitors 10A and 10B are serially connected with each other between the pair of direct current voltage terminals 2 and 3, and the two unit switching circuits 27A and 27B are connected with the two capacitors 10A and 10B, respectively. The primary winding wires N1 as the first winding wires of the unit switching circuits 27A and 27B configure pulse transformers 25A and 25B, respectively, which are wound around an iron core identical to that of secondary winding wires N2A and N2B as the second winding wires connected in parallel with inductance means 9. The secondary winding wire N2A of the pulse transformer 25A and the secondary winding wire N2B of the pulse transformer 25B are connected in parallel with each other, and are connected in parallel with both ends of the inductance means 9 via diodes 26A and 26B, respectively, and an OR connection is established between the secondary winding wire N2A and the secondary winding wire N2B by way of the diodes 26A and 26B. It should be noted that, similarly to the third embodiment, the diodes 26A and 26B can be omitted in some cases, and thus are not essential components.

When the first and second switching elements in the first and second unit switching circuits 27A and 27B simultaneously perform a switching operation due to a turn-on drive signal S from the control circuit 18, a pulsed current flows through each primary winding wire N1 of the pulse transformers 25A and 25B via the four first and second switching elements, and a substantially equivalent reversed-polarity voltage pulse is simultaneously generated in the secondary winding wire N2A and the secondary winding wire N2B of the pulse transformers 25A and 25B, respectively. Such a reversed-polarity voltage pulse is applied to both ends of the inductance means 9 via the diodes 26A and 26B.

Similarly to the second embodiment, in the fourth embodiment, the voltage applied to each of the capacitors 10A and 10B is ½ of the direct current voltage between the direct current voltage terminals 2 and 3. The voltage equivalent to ½ of the voltage of the capacitors 10A and 10B, i.e. the voltage substantially equivalent to ¼ of the direct current voltage between the direct current voltage terminals 2 and 3, is applied to each of the switching elements 11 and 12 in the first and second unit switching circuits 27A and 27B. Moreover, as described above, in a steady plasma state, the voltage being approximately ½ of the maximum direct current voltage Vo is applied to both ends of the switching elements 11 and 12; therefore, the switching elements 11 and 12 may have breakdown voltage of 120% to 150% of ½ of the maximum direct current voltage Vo. Therefore, in a case in which the maximum direct current voltage Vo is 800 V, it is sufficient for the switching elements to have breakdown voltage of 500 to 600 V, and it is possible to use a general-purpose FET, in which the ON resistance is relatively low, and the switching speed is high.

It should be noted that the voltage of each of the capacitors 10A and 10B in the first and second unit switching circuits 27A and 27B is not unbalanced as described below. In the fourth embodiment, an OR connection is established between the secondary winding wires N2A and N2B and both ends of the inductance means 9 by way of the diodes 26A and 26B. Therefore, when voltage of any one of the capacitors 10A and 10B is higher than voltage of the other, due to a voltage difference between the secondary winding wires N2A and N2B, an electric current flows from one of the capacitor 10A or 10B with higher voltage, and when the voltage of the capacitors 10A and 10B becomes equivalent, an electric current also flows from the other one of the capacitor 10A or 10B whose voltage was previously lower. By repeating such an operation, the voltage of the capacitors 10A and 10B of the first and second unit switching circuits 27A and 27B will be automatically balanced to become equivalent. Since resistors for balancing the voltage of the capacitors 10A and 10B may not be connected with the capacitors 10A and 10B, the OR connection between the secondary winding wire N2A and the secondary winding wire N2B is advantageous in terms of power loss and cost.

Although the two unit switching circuits are connected in the second embodiment described with reference to FIG. 3 and the fourth embodiment described with reference to FIG. 5, three or more unit switching circuits may be connected as necessary in a case, for example, in which the direct current voltage Vo is even higher. In addition, in a case of taking countermeasures against abnormal electrical discharge in which a reversed-polarity voltage pulse is generated upon an occurrence of abnormal electrical discharge or predicting an occurrence of abnormal electrical discharge without periodically generating a reversed-polarity voltage pulse, the voltage will always be balanced between the capacitors 10 in which the voltage balance resistors 15 and 16 and like are serially connected, so that the secondary winding wires N2 of the two or more pulse transformer 25 may be serially connected. In this case, since the resistors of the two or more secondary winding wires N2 are serially connected so that the resistance is increased, the direct current flowing therethrough is negligible even without the diode 26, and thus the diode 26 can be omitted.

It should be noted that, similarly to the first embodiment, in the second, third and fourth embodiments, the first and second voltage balance resistors 15, 15A, 15B, 16, 16A and 16B may be connected in parallel with the first and second feedback diodes 13, 13A, 13B, 14, 14A and 14B, respectively. The first and second voltage balance resistors 15, 15A, 15B, 16, 16A and 16B will be connected in parallel with at least one of the first switching elements 11, 11A, 11B, 12, 12A and 12B or the first and second feedback diodes 13, 13A, 13B, 14, 14A and 14B, respectively.

As described above, the direct current power supply 1 for plasma generally includes a smoothing capacitor and inductance means (not illustrated) on the output side; therefore, in the reversed-polarity pulse generating circuit for direct current plasma according to the first to fourth embodiments, such a capacitor and inductance means provided to the direct current power supply 1 for plasma can be used as the capacitor 10 and the inductance means 9. In this case, the load terminals 7 and 8 serve as direct current output terminals of the direct current power supply 1. Therefore, in a case of utilizing an inductance means provided to the direct current output side of the direct current power supply 1 for plasma, the first winding wire 9C or 9C1, 9C2 will be magnetically coupled to the inductance means, or the secondary winding wire N2 of the pulse transformer 25 will be connected in parallel with the inductance means. Furthermore, in a case of utilizing a capacitor provided to the direct current output side of the direct current power supply 1 for plasma, the unit switching circuit 17, 17A, 17B, 27, 27A or 27B will be connected to the capacitor. In this way, by utilizing the smoothing capacitor and the inductance means provided to the output side of the direct current power supply for plasma, the unit switching circuit within the reversed-polarity pulse generating circuit for direct current plasma according to the present invention can be treated as an independent product. Therefore, the reversed-polarity pulse generating circuit for direct current plasma according to the present invention can be implemented merely by connecting a conventional direct current power supply for plasma to the unit switching circuit of the reversed-polarity pulse generating circuit for direct current plasma according to the present invention, which can serve as a direct current power supply for plasma capable of preventing the occurrence of abnormal electrical discharge or promptly extinguishing an abnormal electrical discharge.

Moreover, the direct current plasma power supply unit including the reversed-polarity pulse generating circuit for direct current plasma according to the present invention as described above can achieve effects provided by the reversed-polarity pulse generating circuit for direct current plasma according to the present invention.

INDUSTRIAL APPLICABILITY

The present invention can be used for prevention and elimination of abnormal electrical discharge by applying a reversed-polarity voltage pulse, whose polarity is reversed from the polarity of plasma voltage, to a plasma load of a direct current plasma device, such as a sputtering device, a PVD device, a CVD device and an etching device.

What is claimed is:

1. A reversed-polarity pulse generating circuit for direct current plasma, comprising:
   a pair of direct current voltage terminals, to which direct current voltage from a direct current power supply for plasma is applied;
   a pair of load terminals connected to a plasma load;
   a capacitor connected between the pair of direct current voltage terminals;
   inductance means connected between one end of the capacitor and one of the load terminals;
   a unit switching circuit connected in parallel with the capacitor; and
   a control circuit, to which direct current voltage of the pair of direct current voltage terminals is input, and which controls conduction of a first switching element and a second switching element in the unit switching circuit,
   wherein the unit switching circuit includes:
   a series circuit connected in parallel with the capacitor, the series circuit having the first switching element,
   a first winding wire magnetically coupled to a winding wire of the inductance means or a second winding wire connected in parallel with the inductance means, and the second switching element;
   a first feedback rectifier element connected in parallel with the first switching element and the first winding wire that are connected in series with each other;

a second feedback rectifier element connected in parallel with the second switching element and the first winding wire that are connected in series with each other; and each voltage balance resistor, which is connected in parallel with each of the first switching element and the second switching element or each of the first feedback rectifier element and the second feedback rectifier element, wherein, in a case in which the direct current voltage between the pair of direct current voltage terminals exceeds a set value, voltage at both ends of the capacitor is shared by the first switching element and the second switching element, without the first switching element and the second switching element being electrically conductive, wherein, in a case in which the direct current voltage between the pair of direct current voltage terminals is below the set value, on a periodic basis or upon detecting occurrence of abnormal electrical discharge or detecting prediction of occurrence of abnormal electrical discharge, the first switching element and the second switching element are electrically conductive, reversed-polarity voltage, which is higher than the direct current voltage between the direct current voltage terminals in a plasma generating state, is applied to the inductance means, and difference reversed-polarity voltage, of which level is equivalent to a level of difference between the direct current voltage between the direct current voltage terminals in the plasma generating state and the reversed-polarity voltage, is output between the load terminals, and wherein, in a case in which the first switching element and the second switching element are turned off, during a period in which the first feedback rectifier element and the second feedback rectifier element are electrically conductive, voltage at both ends of the capacitor restricts voltage applied to both ends of the first switching element and both ends of the second switching element.

2. The reversed-polarity pulse generating circuit for direct current plasma according to claim 1, wherein the inductance means and the first winding wire are each wound around an identical wire core to configure a choke transformer, or the first winding wire and the second winding wire are each wound around an identical iron core to configure a pulse transformer.

3. The reversed-polarity pulse generating circuit for direct current plasma according to claim 1, further comprising one or more sets of the capacitor and the unit switching circuit, wherein the plurality of capacitors are serially connected with each other between the pair of direct current voltage terminals, wherein the plurality of unit switching circuits are connected to each of the plurality of capacitors, and wherein each of the first winding wires of the unit switching circuits is wound around the wire core provided to the inductance means, or is wound around an iron core identical to that for each of the second winding wires connected in parallel with the inductance means.

4. The reversed-polarity pulse generating circuit for direct current plasma according to claim 3, wherein the inductance means and each of the first winding wires are wound around the identical wire core to configure a choke transformer, or each of the first winding wires and each of the second winding wires are wound around identical wire cores to configure a pulse transformer.

5. A direct current plasma power supply unit, comprising the reversed-polarity pulse generating circuit for direct current plasma according to claim 1.

* * * * *